United States Patent
Lee

(12) 
(10) Patent No.: US 6,208,518 B1
(45) Date of Patent: Mar. 27, 2001

(54) FASTENING DEVICE FOR A HEAT SINK

(75) Inventor: Richard Lee, Taipei (TW)

(73) Assignee: Hon Hai Precision Ind. Co. Ltd., Taipei Hsien (TW)

( * ) Notice: Subject to any disclaimer, the term of this patent is extended or adjusted under 35 U.S.C. 154(b) by 0 days.

(21) Appl. No.: 09/438,027

(22) Filed: Nov. 10, 1999

(30) Foreign Application Priority Data

Jun. 29, 1999 (TW) .................................................. 88210758

(51) Int. Cl.[7] ...................................................... H05K 7/20
(52) U.S. Cl. ......................... 361/704; 361/700; 361/702; 361/709; 257/707; 257/713; 165/80.3; 174/16.3
(58) Field of Search .................................... 361/690, 700, 361/704, 707, 702–710, 717–720, 722, 688, 689; 174/16.3; 24/457–459, 524, 518, 517, 295; 165/80.2, 80.3, 80.4, 185; 257/706–727; 248/505, 510, 316.7; 439/487, 330, 331, 525, 607, 73

(56) References Cited

U.S. PATENT DOCUMENTS

| | | | | |
|---|---|---|---|---|
| 5,617,292 | * | 4/1997 | Steiner | 361/704 |
| 5,638,258 | * | 6/1997 | Lin | 361/704 |
| 5,660,562 | * | 8/1997 | Lin | 439/487 |
| 5,671,118 | * | 9/1997 | Blomquist | 361/704 |
| 5,684,676 | * | 11/1997 | Lin | 361/704 |
| 5,771,960 | * | 6/1998 | Lin | 165/80.3 |
| 5,828,553 | * | 10/1998 | Chiou | 361/704 |
| 5,860,195 | * | 1/1999 | Wang | 24/459 |
| 5,933,326 | * | 8/1999 | Lee | 361/704 |
| 5,953,212 | * | 9/1999 | Lee | 361/709 |

* cited by examiner

Primary Examiner—Leo P. Picard
Assistant Examiner—Michael Datskovsky
(74) Attorney, Agent, or Firm—Wei Te Chung

(57) ABSTRACT

A fastening device for a heat sink comprises a retaining element and an operating element. The retaining element is formed by stamping an elongated metal sheet and includes a spring portion which has a bifurcating portion extending from one end and a first latching arm depending perpendicularly from an opposite end. The bifurcating portion includes a pair of arms and an arcuate strip bending substantially upward and extending from between the arms. A pivot outwardly projects from the flank of the end of each arm of the bifurcating portion. The operating element is formed by stamping an elongated metal sheet and includes a second latching arm and a manual operating portion which are perpendicular to each other. A pair of pivoting sections each defining a pivot opening extends perpendicular to and from substantially the middle of opposite edges of the second latching arm of the operating element. A first latch opening is defined adjacent to the free end of the first latching arm of the retaining element and a second latch opening is defined adjacent to the free end of the second latching arm of the operating element, each latching a tab on an opposite side of a socket when used to fasten a heat sink to a CPU and socket.

11 Claims, 3 Drawing Sheets

FASTENING DEVICE FOR A HEAT SINK

BACKGROUND OF THE INVENTION

The present invention relates to a fastening device for a heat sink, and particularly to a fastening device which is convenient to operate for attaching a heat sink to a CPU.

As CPUs run at higher speeds, they generate more heat. Heat dissipation becomes a problem, and heat sinks are often employed to solve this problem. A fastening device is ordinarily used to tightly attach a heat sink to a CPU to achieve good heat transference therebetween. One such conventional fastening device is disclosed in Taiwan patent application No. 83217100, which discloses a fastening device for a combination including a heat sink, a CPU and an electrical socket. The unitarily formed fastening device comprises a spring portion which fits in a channel among the fins of a heat sink. A pair of latching arms extends toward the electrical socket from opposite ends of the spring portion. A pair of latching holes is defined in the vicinity of free ends of the latching arms to engage with tabs on opposite sides of the electrical socket. Each latching arm defines an opening for a tool (e.g. screwdriver) located at a position above each latching hole. While the fastening device attaches the heat sink to the CPU, both latching holes respectively lock with the tabs on the sides of the electrical socket, and the spring portion of the fastening device presses against the heat sink, tightly pressing the heat sink to the CPU. The fastening device is relatively difficult to latch and unlatch, and requires using a tool, such as a screwdriver, inserted into the openings in the latching arms to latch or unlatch.

Taiwan patent application No. 86212167 or U.S. Pat. No. 5,671,118 discloses another fastening device for fastening a heat sink, a CPU and an electrical socket together. The fastening device comprises a retaining element and an operating element engaged with one another. The retaining element includes a spring portion which fits in a channel formed among the fins of the heat sink and presses against the heat sink. A first latching arm extends vertically from one end of the spring portion toward the electrical socket. A latching hole is defined in the latching arm to lock the latching arm to a tab on the side of the socket; a rib is disposed on the other end of the spring portion to engage with the operating element. The operating element is rotatably engaged with the rib of the retaining element by a latch on an end of the operating element. A second latching arm in the operating element corresponds to the first latching arm. A second latching hole is defined on the second latching arm to engage with a tab on the other side of the electrical socket. Because the operating element is rotatable, it is more susceptible to movement after assembly than an integrally formed fastening device, and is thus less reliable, especially under conditions of vibration or an unexpected force.

BRIEF SUMMARY OF THE INVENTION

A main object of the present invention is to provide a fastening device for a heat sink such that the heat sink will be tightly attached to a CPU and can be conveniently engaged or disengaged.

A fastening device for a heat sink of the present invention comprises a retaining element and an operating element. The retaining element is formed by bending an elongated metal sheet and includes a spring portion. A first latching arm substantially perpendicular to the spring portion depends from one end of the spring portion. A latch opening is disposed in the vicinity of a free end of the first latching arm. A bifurcating portion extends from the other end of the spring portion. The bifurcating portion has a pair of arms, and a pivot projects from the outer flank of the end of each arm, respectively. An arcuate strip substantially upwardly extends and bends from the spring portion between the arms of the bifurcating portion. The strip is longer than the arms, and the end thereof is higher than the ends of the arms. The inverted L-shaped operating element is formed by stamping and bending an elongated metal sheet. The operating element comprises a second latching arm and a manual operating portion which are perpendicular to each other. The second latching arm is planar. A pair of pivoting sections perpendicularly extends from substantially the middle and on the opposite edges of the second latching arm. Each pivoting section defines a pivot opening. A second latch opening is defined adjacent the free end of the second latching arm and corresponds to the first latch opening of the first latching arm of the retaining element.

Other objects, advantages and novel features of the invention will become more apparent from the following detailed description when taken in conjunction with the accompanying drawings.

DETAILED DESCRIPTION OF THE INVENTION

Figure 1:
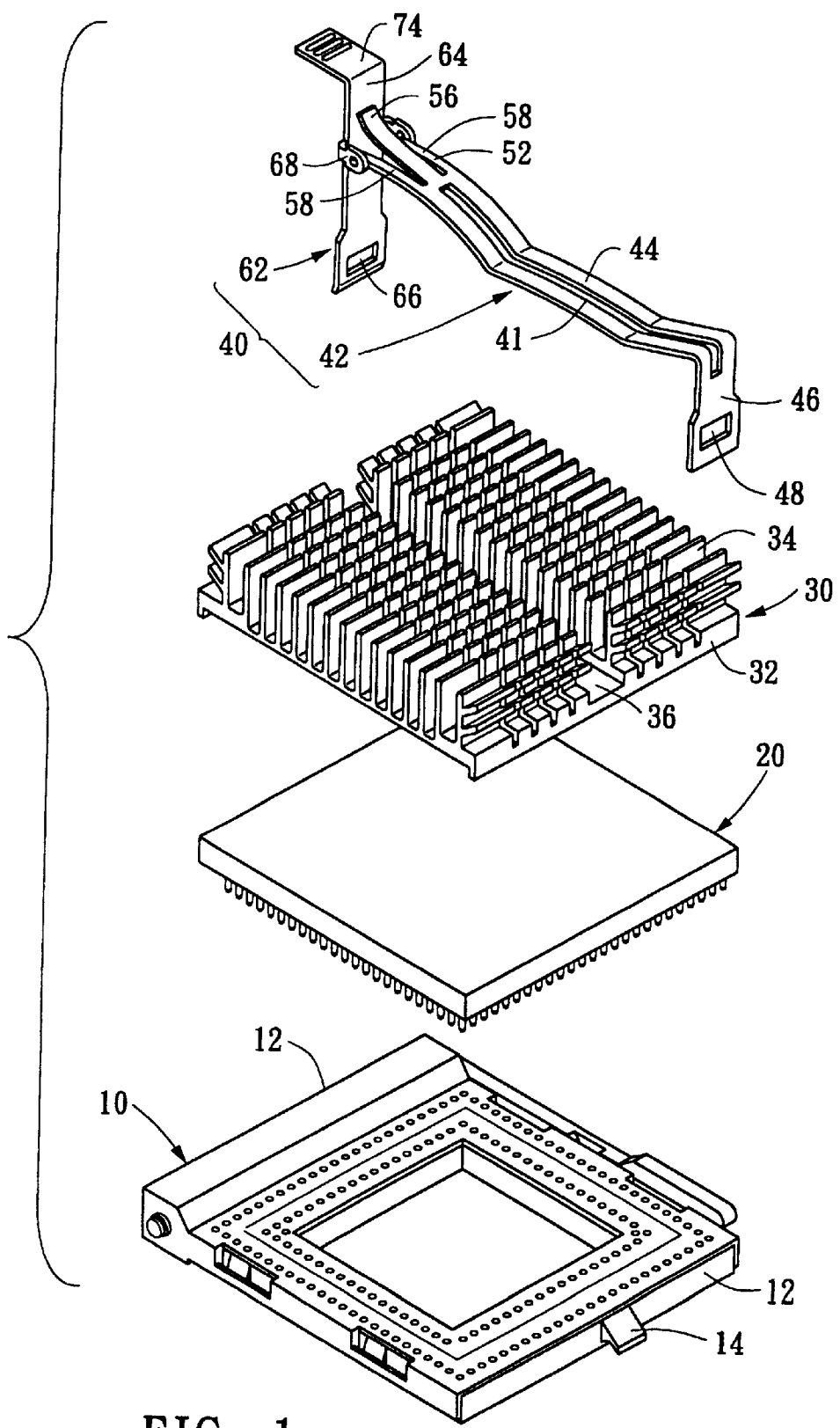
FIG. 1 is an exploded perspective view of a fastening device for a heat sink, a heat sink, a CPU and an electrical socket.

Referring to FIG. 1, an electrical socket 10 substantially square has a pair of opposite sides 12. Each side 12 defines a tab 14 for engaging with a fastening device 40 for a heat sink. A CPU 20 is inserted into the electrical socket 10. A heat sink 30 comprises a base 32 and a plurality of fins 34 disposed thereon. A channel 36 is defined among the fins for receiving the fastening device.

Figure 2:
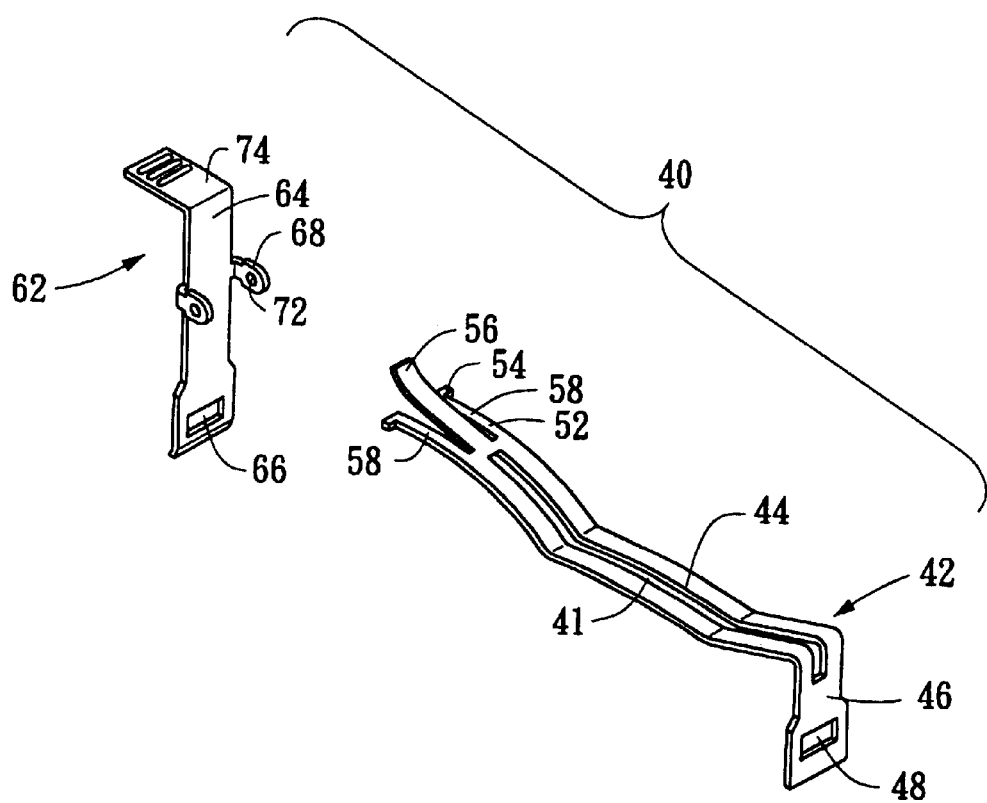
FIG. 2 is an exploded perspective view of a fastening device for a heat sink of the present invention.

Referring to FIGS. 1 and 2, the fastening device 40 consists of a retaining element 42 and an operating element 62. The retaining element 42, formed by stamping and bending an elongated metal sheet, comprises a spring portion 44 having a first latching arm 46 on one end and a bifurcating portion 52 on an opposite end thereof. An elongated slot 41 is defined through the middle of the spring portion 44 of the retaining element 42 for increasing the resilience of the retaining element 42. The spring portion 44 fits in a channel 36 among the fins 34 of a heat sink 30 for pressing the heat sink 30 against a CPU 20. The first latching arm 46 depends downward from one end of the spring portion 44 and is substantially perpendicular to the spring portion 44. A first latch opening 48 is defined adjacent to the free end of the first latching arm 46 for locking with the tab 14 on one side 12 of the electrical socket 10. The bifurcating portion 52 extends from the other end of the spring portion 44 and includes a pair of arms 58. A pivot 54 outwardly projects from the outer flank of the end of each arm 58. In addition, between the two arms 58, an arcuate strip 56 substantially upwardly bends and extends from the spring portion 44. The strip 56 is longer than the arms 58, and the end of the strip 56 is higher than the ends of the arms 58.

The inverted L-shaped operating element 62 is formed by stamping and bending an elongated metal sheet, and thus it is simple to manufacture. The operating element 62 includes a second latching arm 64 and a manual operating portion 74. The second latching arm 64 is planar. A pair of pivoting sections 68 depends from opposite edges of a middle portion (not labeled) of and in a direction perpendicular to the second latching arm 64. Each pivoting section 68 defines a pivot opening 72 to correspondingly engage with the pivots 54 of the bifurcating portion 52. Thus, the operating element 62 engages with the retaining element 42. A second latch opening 66 is defined adjacent to the free end of the second latching arm 64. The second latch opening 66 corresponds to the first latch opening 48 in the first latching arm 46 of the retaining element 42 for locking with the tab 14 on the other side 12 of the electrical socket 10. The manual operating portion 74 perpendicularly extends from the second latching arm 64 opposite the second pivoting sections 68.

During mating of the retaining element 42 with the operating element 62, the arms 58 of the bifurcating portion 52 of the retaining element 42 are pinched together. The pivots 54 of the bifurcating portion 52 are inserted into the pivot openings 72 in the pivoting sections 68 of the operating element 62. The strip 56 of the retaining element 42 abuts against the second latching arm 64 of the operating element 62, the abutting position being above the pivot openings 72 of the operating element 62. Therefore, unexpected unlatching of the lower portion of the latching arm 62 from the tab 14 on the socket 10 is avoided.

Figure 3:
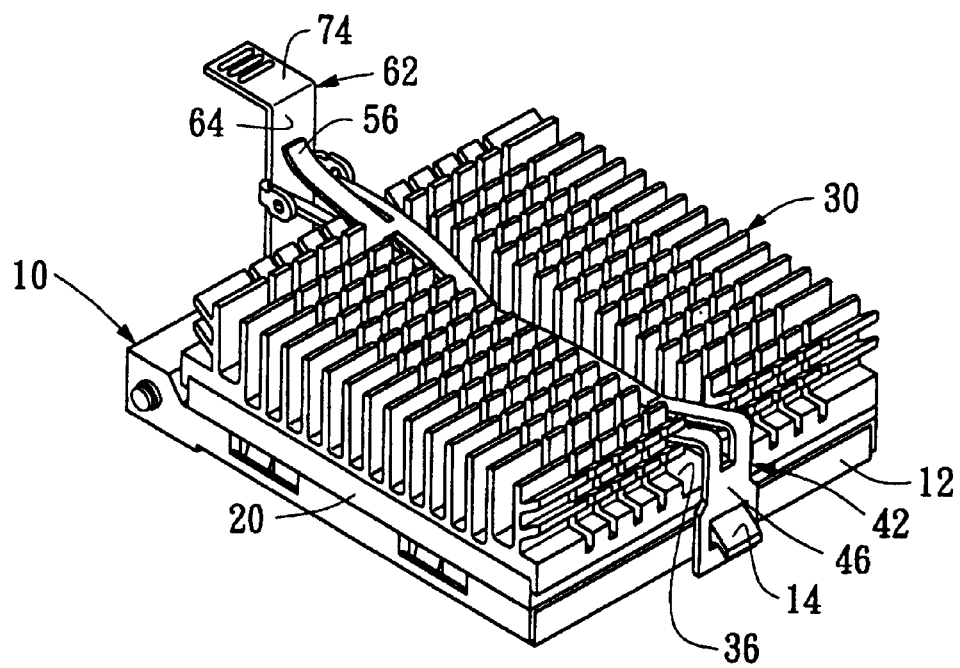
FIG. 3 is an assembled perspective view of FIG. 1.

Referring to FIGS. 1 and 3, during assembly, the CPU 20 is inserted into the electrical socket 10. The heat sink 30 is then placed with its base 32 against the top of the CPU 20, and the channel 36 of the heat sink 30 is aligned with the tabs 14 on the sides 12 of the electrical socket 10. The fastening device 40 is slantwise disposed in the channel 36, and the first latch opening 48 of the first latching arm 46 is locked to the tab 14 on the side 12 of the electrical socket 10. Finally, the manual operating portion 74 of the operating element 62 is pressed downward and slightly inward toward the retaining element 42. The fastening device 40 rotates from the inclining state to a horizontal state, and the lower portion (not labeled) of the second latching arm 64 is rotated inwardly. The second latch opening 66 of the second latching arm 64 is locked to the tab 14 on the other side 12 of the electrical socket 10. Thus the heat sink 30 is tightly attached to the CPU 20. After assembly, the strip 56 of the retaining element 42 abuts against the second latching arm 64 of the operating element 62, the abutting position being above the pivoting point at the pivot openings 72. A resilient force is exerted by the strip 56 against the second latching arm 64 above the pivot point (pivot openings 72) which acts to press the lower portion of the second latching arm 64 against the side 12 of the electrical socket 10. This force acts to assure secure latching of the second latch opening 66 with the tab 14 of the socket 10 under the conditions of vibration or unexpected force.

During disengagement, the manual operating portion 74 is pressed downward and slightly inward toward the retaining element 42 and the lower portion of the second latching portion 64 swings outwardly. Thus, the second latch opening 66 disengages from the tab 14 of the electrical socket 10. The strip 56 not only provides an abutting force when assembled to a heat sink but also has appropriate resilience for stretch distortion during disengaging.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastening device for a heat sink, comprising:
    a retaining element including a spring portion, a first latching arm on one end of the spring portion and a bifurcating portion on an opposite end of the spring portion, the first latching arm defining a first latch opening for latching a tab provided on one side of an electrical socket, the bifurcating portion having a pair of arms and a strip between the arms, the strip being longer than the arms and the free end of the strip terminating at a level higher than the free ends of the arms; and
    an operating element pivotably engaged with the retaining element and including a manual operating portion and a second latching arm, the second latching arm having a pair of pivoting sections for pivotally engaging with the bifurcating portion of the retailing element and a second latch opening for latching another tab provided on another side of the electrical socket, a portion of the second latching arm above the pivoting sections being pressed by the strip of the retaining element, thereby firmly securing the second latching arm to the electrical socket.

2. The fastening device for a heat sink as claimed in claim 1, wherein the strip is arcuate, substantially upwardly bends and extends from the spring portion.

3. The fastening device for a heat sink as claimed in claim 1, wherein a pivot outwardly extends from each arm of the bifurcating portion of the retaining element, and a pivot opening is defined in each of the pivoting sections for receiving the pivot.

4. The fastening device for a heat sink as claimed in claim 1, wherein the second latching arm of the operating element is substantially planar.

5. The fastening device for a heat sink as claimed in claim 4, wherein each pivoting section depends from one of two opposite edges of the second latching arm.

6. The fastening device for a heat sink as claimed in claim 1, wherein the manual operating portion outwardly extends from an upper end of the second latching arm.

7. The fastening device for a heat sink as claimed in claim 1, wherein said retaining element is unitarily formed by stamping and bending an elongated metal sheet, and defines an elongated slot through a middle of the spring portion of the retaining element for increasing the resiliency of the spring portion of the retaining element.

8. The fastening device for a heat sink as claimed in claim 1, wherein said operating element is unitarily formed by stamping and bending an elongated metal sheet.

9. A fastening device for a heat sink assembly, comprising:
    a retaining element including a spring portion defining first and second opposite ends, an elongated slot defined through a middle of the spring portion for increasing the resiliency of the spring portion of the retaining element, and a first latching arm extending downwardly from the first end; and
    an operating element pivotably attached to the second end of the spring portion via a pivotal section thereof, said operating element including a manual operation portion and a second latching arm, said second latching arm defining locking means for latchable engagement with a socket thereunder, said manual operation portion positioned above the pivotal section while said locking means positioned below the pivotal section; and means for preventing the manual operation portion from inadvertently inwardly pivotally moving toward the retaining element, so as to assure the locking means reliably latchably engages the socket.

10. The assembly as claimed in claim 9, wherein said means includes a strip extending from the spring portion of the retaining element with thereof one free end engaged with a portion of the operation element above the pivotal section.

11. A heat sink assembly comprising:

a socket having two opposite tabs on two sides;

a CPU positioned atop the socket;

a heat sink positioned atop the CPU;

a fastening device positioned atop the heat sink;

said fastening device including:

a retaining element defining a spring portion with a first latch arm integrally extending downwardly from a first end thereof, said first latch arm defining therein a first locking means latchably engaged with one of said two tabs of the socket; and an operating element pivotally, via a pivotal section thereof, attached to a second end of the spring portion opposite to said first end, said operating element including a manual operating portion and a second substantially planar latch arm with thereof a second locking means which latchably engages the other of said two tabs of the socket; wherein said fastening device further includes means located above the pivotal section to bias the manual operating portion outwardly, so as to assure the second locking means will not be disengaged from the corresponding tab inadvertently.

* * * * *